(12) United States Patent
Bruno et al.

(10) Patent No.: US 12,385,788 B2
(45) Date of Patent: Aug. 12, 2025

(54) THERMOGRAPHIC SENSOR WITH THERMAL TRANSISTORS DRIVEN BY THERMO-COUPLES

(71) Applicant: STMICROELECTRONICS S.r.l., Agrate Brianza (IT)

(72) Inventors: Giuseppe Bruno, Paterno' (IT); Michele Vaiana, San Giovanni la Punta (IT); Maria Eloisa Castagna, Catania (IT); Angelo Recchia, Fasano (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 693 days.

(21) Appl. No.: 17/537,074

(22) Filed: Nov. 29, 2021

(65) Prior Publication Data
US 2022/0170795 A1 Jun. 2, 2022

(30) Foreign Application Priority Data
Nov. 30, 2020 (IT) .................. 102020000029141

(51) Int. Cl.
*G01J 5/24* (2006.01)
*G01J 5/14* (2006.01)
(Continued)

(52) U.S. Cl.
CPC . *G01J 5/24* (2013.01); *G01J 5/14* (2013.01); *G01J 5/48* (2013.01); *H10D 48/50* (2025.01)

(58) Field of Classification Search
None
See application file for complete search history.

(56) References Cited

U.S. PATENT DOCUMENTS 4,173,970 A * 11/1979 Momin ................ A61B 5/6842
374/186
7,489,024 B2 2/2009 Socher et al.
(Continued)

FOREIGN PATENT DOCUMENTS

CN 102105768 A 6/2011
CN 103247337 A 8/2013
(Continued)

OTHER PUBLICATIONS

Avraham et al., "Modeling the thermal performance of a packaged MEMS thermal sensor at wide pressure range for IoT applications," IEEE International Conference on Microwaves, Communications, Antennas and Electronics Systems (COMCAS), Tel-Aviv, Israel, Nov. 4-6, 2019, 4 pages.
(Continued)

*Primary Examiner* — Erica S Lin
(74) *Attorney, Agent, or Firm* — Seed IP Law Group LLP (57) ABSTRACT

A thermographic sensor is proposed. The thermographic sensor includes one or more thermo-couples, each for providing a sensing voltage depending on a difference between a temperature of a hot joint and a temperature of a cold joint of the thermo-couple; the thermographic sensor further comprises one or more sensing transistors, each driven according to the sensing voltages of one or more corresponding thermo-couples for providing a sensing electrical signal depending on its temperature and on the corresponding sensing voltages. A thermographic device including the thermographic sensor and a corresponding signal processing circuit, and a system including one or more thermographic devices are also proposed.

10 Claims, 8 Drawing Sheets

(51) Int. Cl.
*G01J 5/48* (2022.01)
*H10D 48/50* (2025.01)

(56) References Cited

U.S. PATENT DOCUMENTS

| | | |
|---|---|---|
| 2006/0244067 A1 | 11/2006 | Socher et al. |
| 2012/0119088 A1 | 5/2012 | Honda et al. |
| 2013/0248714 A1 | 9/2013 | Honda et al. |
| 2014/0036953 A1 | 2/2014 | Kimura et al. |
| 2017/0221959 A1* | 8/2017 | Udrea .................... H01L 31/09 |
| 2022/0170794 A1 | 6/2022 | Castagna et al. |
| 2023/0324229 A1 | 10/2023 | Castagna et al. |

FOREIGN PATENT DOCUMENTS

| | | |
|---|---|---|
| CN | 104006889 A | 8/2014 |
| CN | 104819779 A | 8/2015 |
| CN | 105588958 A | 5/2016 |
| CN | 108291840 A | 7/2018 |
| JP | 2001112164 A | 4/2001 |
| JP | 2007251481 A | 9/2007 |

OTHER PUBLICATIONS

Fedirko, V.A. et al., "Thermopile IR Sensor Arrays," Proceedings of the Scientific-Practical Conference, Research and Development, 2016, pp. 39-48.
Hamamatsu Photonics, Thermopile Detector, www.hamamatsu.com, 2012, pp. 1-9.
Hopper, R. et al., "A CMOS-Based Thermopile Array Fabricated on a Single $SiO_2$ Membrane," *Proceedings* 2(13):878, 2018, 4 pages.
Goren et al., "CMOS-SOI-MEMS Transistor (TeraMOS) for Terahertz Imaging," IEEE International Conference on Microwaves, Communications, Antennas and Electronics Systems (COMCAS), Nov. 9-11, 2009, Tel-Aviv, Israel, 17 pages.
Nemirovsky, Y., "CMOS-SOI-MEMS," URL=https://yaelnemirovsky.net.technion.ac.il/sample-page/cmos-soi-mems/, download date Sep. 23, 2021, 2 pages.
Panasonic (PAISEU) "Grideye Sensor," PowerPoint slide show, Jan. 6, 2017, 41 pages.
Zviagintsev, A. et al., "CMOS Disruptive Sensing Systems for Dual Applications," Israel Institute of Technology, Department of Electrical Engineering, Jun. 2017, 1 page.
Zviagintsev, T. et al., "Micro-machined C 1OS-SOT transistor (TMOS) thermal sensor operating in air," International Conference on Microwaves, Antennas, Communications and Electronic Systems, Tel-Aviv, Israel, Nov. 13-15, 2017, 4 pages.

* cited by examiner

THERMOGRAPHIC SENSOR WITH THERMAL TRANSISTORS DRIVEN BY THERMO-COUPLES

BACKGROUND

Technical Field

The present disclosure relates to the thermographic field. More specifically, this disclosure relates to thermographic sensors.

Description of the Related Art

The background of the present disclosure is hereinafter introduced with the discussion of techniques relating to its context. However, even when this discussion refers to documents, acts, artifacts and the like, it does not suggest or represent that the discussed techniques are part of the prior art or are common general knowledge in the field relevant to the present disclosure.

Thermographic sensors are commonly used to detect thermal characteristics of their fields of view (each comprising one or more material objects). The thermographic sensors are capable of sensing thermal radiations (i.e., electromagnetic radiations generated by thermal motion of their particles), which are emitted by every (material) objects with a temperature above absolute zero; since the objects behave substantially as black bodies (i.e., with the emitted thermal radiations only depending on the corresponding temperatures), the thermal radiations that are sensed then represents their temperatures. For example, the thermographic sensors are used to measure the temperatures of objects taking the whole field of view (such as in thermo-scanners). Alternatively, the thermographic sensors are used to acquire thermographic images (or thermograms) each representing a distribution of the temperature of the field of view (as defined by the thermal radiations that are emitted from its different locations); the thermographic images are used in thermal imaging (or thermography) applications to represent any field of view (in terms of thermal characteristics thereof) independently of its illumination, i.e., even when it is not visible to human eye.

Several types of thermographic sensors are available. For example, thermographic sensors of uncooled type (also known as thermal sensors) sense changes in an electrical parameter depending on changes in their temperature related to the amount of thermal radiation that is absorbed; these thermographic sensors may operate at room temperature, without requiring any complex and expensive cooling equipment.

A typical (uncooled) thermographic sensor is based on thermally insulated MOS (TMOS) transistors, \having electrical characteristics strongly depending on temperature. In this case, two arrays of TMOS transistors are provided: an array is exposed to the thermal radiation and another array is kept blind (for example, by shielding it with a metal layer). Each TMOS transistor provides a signal depending on its temperature (for example, a current when a working point thereof is set by a biasing voltage). A differential signal indicative of a temperature gradient between each pair of TMOS transistors in the exposed array and in the blind array may then be generated by subtracting their signals, from which differential signal the temperature gradient may be calculated (in case a very accurate measure is required, such as for the temperature of a human body, a real temperature at the TMOS transistor in the blind array may also be measured, for example, by a separate temperature sensor like based on a thermistor).

A completely different thermographic sensor is instead based on thermo-piles (TPs). A thermo-pile is formed by a plurality of thermo-couples that are connected to each other, generally in series. Each thermo-couple converts a temperature gradient between a hot and a cold junction (generated by the thermal radiation) into electrical energy (measuring its amplitude) according to the Seebeck effect. For example, the thermo-couple comprises two (electric) conductors of different materials (having different Seebeck coefficients). The conductors are joined at a point whose temperature has to be measured (hot junction or joint), whereas their free ends are maintained at a reference temperature (cold junction or joint). When a temperature gradient exists between the hot joint and the cold joint, a corresponding voltage is generated at the cold joint, from which voltage the temperature gradient may be calculated (as above, in case a very accurate measure is required a real temperature at the cold joint may also be measured, for example, by a separate temperature sensor like based on a thermistor). The measured voltage is very small (of the order of $\mu V$); the connection in series of a number of thermo-couples in a thermo-pile then generates a higher (total) measured voltage providing a better resolution.

Several factors affect the performance of the thermographic sensors. For example, it is desirable to have a high sensitivity, a low response time and a limited thermal cross-talk among the sensing elements. However, the performance of the available thermographic sensors (based on either the TMOS transistors or the thermo-couples) are not completely satisfactory; this adversely affects the performance of the corresponding thermographic sensors (for example, expressed in terms of Noise Equivalent Thermal Difference, or NETD, given by the amount of thermal radiation that would be needed to match an internal noise such that a signal-to-noise ratio is equal to one). This hinders the use of the thermographic sensors in specific fields (for example, in consumer applications, especially of mobile type).

BRIEF SUMMARY

A simplified summary of the present disclosure is herein presented in order to provide a basic understanding thereof; however, the sole purpose of this summary is to introduce some concepts of the disclosure in a simplified form as a prelude to its following more detailed description, and it is not to be interpreted as an identification of its key elements nor as a delineation of its scope.

In general terms, the present disclosure is based on the idea of combining thermal transistors with thermo-couples.

For example, an aspect provides a thermographic sensor. The thermographic sensor comprises one or more thermo-couples, each for providing a sensing voltage depending on a difference between a temperature of a hot joint and a temperature of a cold joint of the thermo-couple; the thermographic sensor further comprises one or more sensing transistors, each driven according to the sensing voltages of one or more corresponding thermo-couples for providing a sensing electrical signal depending on its temperature and on the corresponding sensing voltages.

A further aspect provides a thermographic device comprising this thermographic sensor and a corresponding signal processing circuit.

A further aspect provides a system comprising one or more thermographic devices as above.

BRIEF DESCRIPTION OF THE SEVERAL VIEWS OF THE DRAWINGS

The solution of the present disclosure, as well as further features and the advantages thereof, will be best understood with reference to the following detailed description thereof, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes, like value, content and representation). In this respect, it is expressly intended that the drawings are not necessary drawn to scale (with some details that may be exaggerated and/or simplified) and that, unless otherwise indicated, they are merely used to illustrate the structures and procedures described herein conceptually. For example.

DETAILED DESCRIPTION

Figure 1:
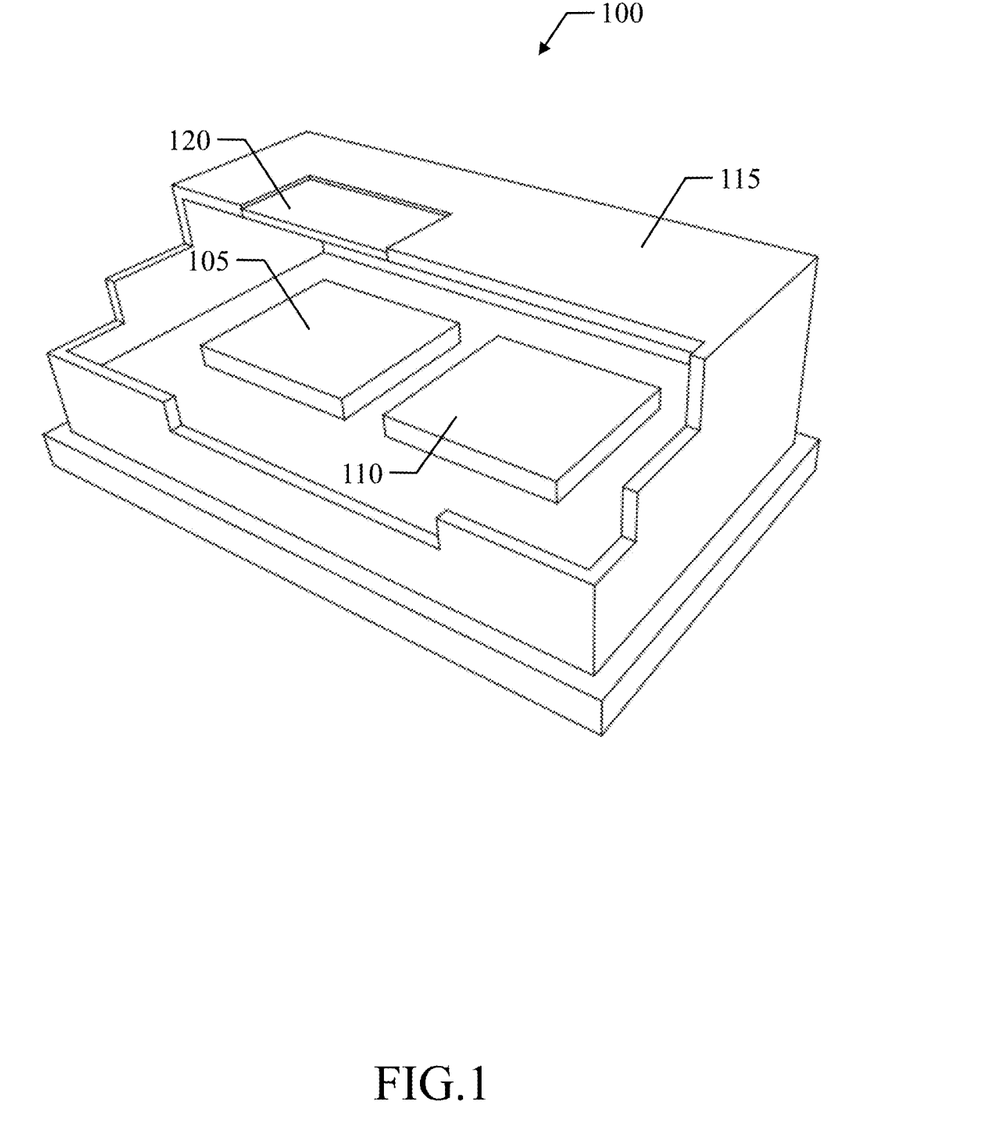
FIG. 1 shows a pictorial representation in partially cut-away view of a (packaged) thermographic device wherein the solution according to an embodiment of the present disclosure may be applied.

With reference in particular to FIG. 1, a pictorial representation is shown in partially cut-away view of a (packaged) thermographic device 100 wherein the solution according to an embodiment of the present disclosure may be applied.

The thermographic device 100 is used to detect thermal characteristics of (material) objects comprised in its field of view, e.g., a part of the world within a solid angle to which the thermographic device is sensitive; the thermographic device 100 may find application in different fields, for example, for medical, security, military, industrial and the like applications. The thermographic device 100 comprises the following components.

A thermographic sensor 105 of uncooled type is used to sense electromagnetic radiations that are emitted by every objects with a temperature above absolute zero, e.g., according to the black body radiation law. In some implementations, the thermographic sensor 105 is sensitive to infrared (IR) radiations, with wavelengths in the (infrared) range from 1.1 μm to 20.0 μm, where infrared radiations are emitted from most of the objects near room temperature. The thermographic sensor 105 then outputs one or more temperature (electrical) signals indicative of the infrared radiation that is sensed, and then of the corresponding temperature of the objects in the field of view; in some implementations, the thermographic sensor 105 may output a single temperature signal or multiple temperature signals that represent a temperature gradient of the whole field of view or of different locations of the field of view, respectively, with respect to a reference (environment) temperature. A processing unit 110 is coupled with the thermographic sensor 105 for processing the temperature signals provided by the thermographic sensor 105, for example, by performing analog-to-digital conversion, temperature correction, such as by adding the environment temperature as measured by a separate temperature sensor, like based on a thermistor, in case a very accurate measure is required and so on. The processing unit 110 outputs an indication of the temperature of the field of view or a (digital) thermographic image of the field of view, e.g., a bitmap of (digital) values for basic picture elements (pixels) of the thermographic image, with each (pixel) value defining a brightness of the pixel as a function of the temperature of the corresponding location of the field of view). The thermographic sensor 105 and the processing unit 110 are enclosed in a package 115, which protects them at the same time allowing access thereto; for example, the package 115, such as of ceramic type, shields the infrared radiations, with the exception of a window 120 provided with lens (such as of silicon) that concentrate the infrared radiations onto a (sensing) portion of the thermographic sensor 105.

Figure 2:
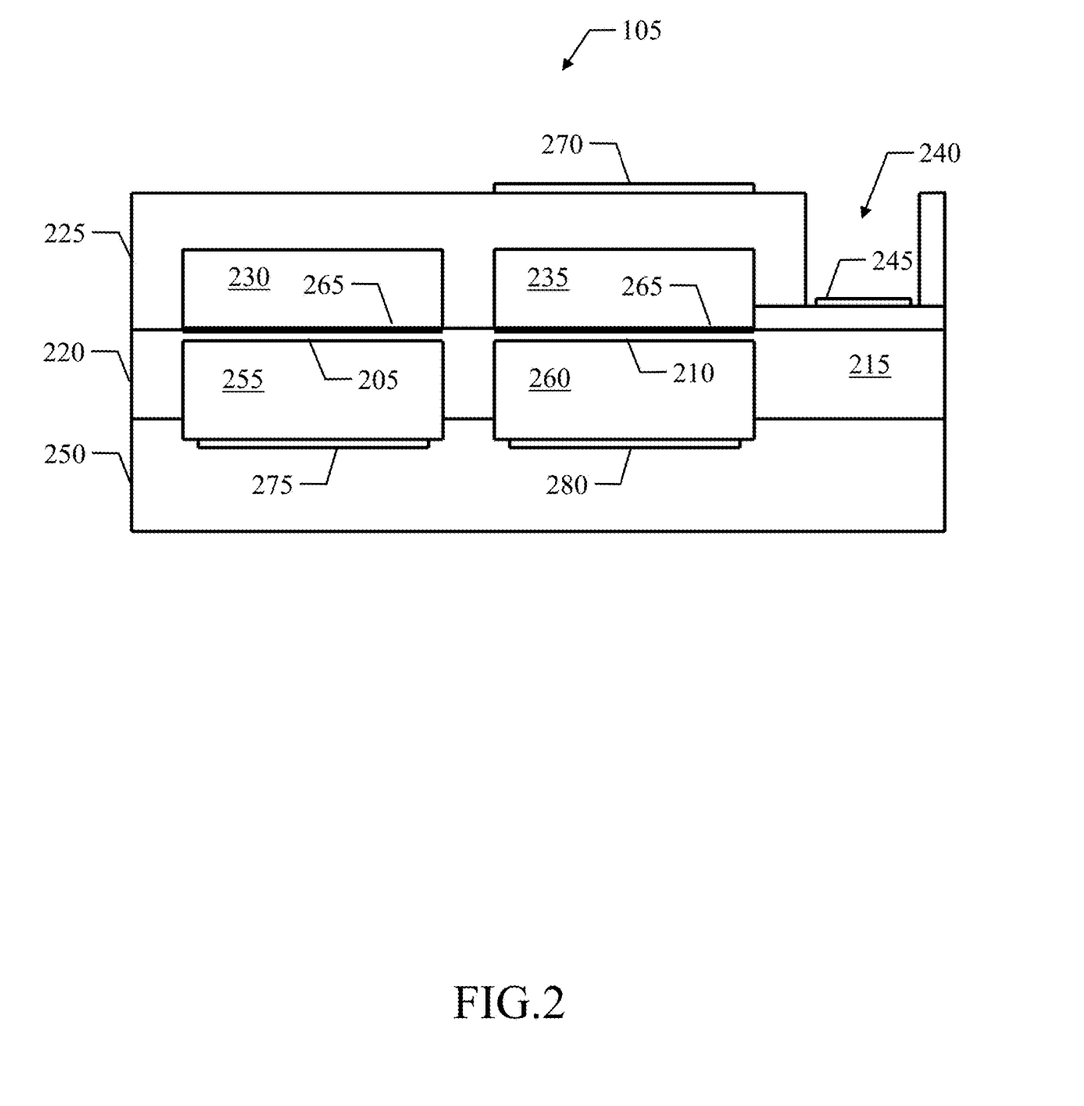
FIG. 2 shows a schematic cross-section view of a thermographic sensor wherein the solution according to an embodiment of the present disclosure may be applied.

With reference now to FIG. 2, a schematic cross-section view is shown of a thermographic sensor 105 wherein the solution according to an embodiment of the present disclosure may be applied.

The thermographic sensor 105 comprises two corresponding arrays of sensing elements 205 and reference elements 210, respectively, for example, starring arrays, i.e., 2-dimensional arrays each of 8×8 sensing/reference elements 205, 210. As described in detail in the following, each sensing/reference element 205,210 provides a sensing/reference (electrical) signal depending on its temperature. The sensing elements 205 are exposed to the infrared radiation to be sensed, so as to be heated to a temperature depending thereon; conversely, the reference elements 210 are blind, e.g., shielded from the infrared radiations as described in the following, so as to remain at an (environment) temperature independent of the infrared radiation. A comparison circuit compares the sensing signals of the sensing elements 205 and the reference signals of the reference elements 210 to obtain the temperature signals; in some implementations, the comparison circuit may compare a common sensing signal provided by all the sensing elements 205 with a common reference signal provided by all the reference elements 210 to obtain a single temperature signal representing the temperature gradient of the whole field of view, or it may compare the sensing signal provided by each sensing element 205 with the reference signal provided by the corresponding reference element 210 to obtain the corresponding temperature signal representing the temperature gradient of the corresponding location of the field of view.

In an example implementation, the array of sensing elements 205, the array of reference elements 210 and the comparison circuit 215 are integrated on a semiconductor on insulator body, such on a die 220 of SOI type manufactured with standard CMOS process steps with the addition of MEMS process steps (so as to define a corresponding chip). In some implementations, as described in detail herein, the array of sensing elements 205 and the array of reference elements 210 are provided on corresponding suspended membranes. For example, the suspended membranes may be released from a bulk of the die 220 or they may be released from a front of the die 220 (such as by a wet etching process, without removing all the substrate).

Moreover, the thermographic sensor 105 comprises a (top) semiconductor body, such as a die 225 of silicon. A cavity 230 corresponding to the array of sensing elements 205 and a cavity 235 corresponding to the array of reference elements 210 are formed, for example, by etching, in the die 225. Moreover, a window 240 is opened through the die 225 (for example, by etching), so as to expose a lateral portion of the die 220 wherein I/O contacts 245 (for example, pads) of the thermographic sensor 105 are provided. The thermographic sensor 105 further comprises a (bottom) semiconductor body, such as a die 250 of silicon. The die 225 and the die 250 are bonded to the die 220 with their cavities 230,235 facing it, for example, with a glass frit technique via corresponding intermediate layers of glass, not shown in the figure, so as to encapsulate the array of sensing elements 205 in a vacuum-sealed structure defined by the cavity 230 and a cavity 255 of the die 220 corresponding to the sensing elements 205, and to encapsulate the array of reference elements 210 in a vacuum-sealed structure defined by the cavity 235 and a cavity 260 of the die 220 corresponding to the reference elements 210, where sealed structures prevent heat sink from atmosphere and protect the sensing/reference elements 205,210 mechanically.

The die 225 is substantially transparent to the infrared radiations. Therefore, the die 220 comprises an absorbing layer 265 in the released membranes 205 and 210 at the cavities 230 and 235, respectively; the absorbing layer 265 is made of an infrared high-absorbance material, such as deposited TiN, so as to improve the absorption of the infrared radiations to be sensed by the underling sensing elements 205. A shielding layer 270 of an infrared high-reflectance material, such as deposited metal, is provided on top of the die 225 at the cavity 235, to shield the underling reference elements 210 from the infrared radiations. Moreover, the die 250 comprises a vacuum getter 275 within the cavity 255 and a vacuum getter 280 within the cavity 260. The vacuum getters 275, 280 are made of a layer of a reactive material, such as a deposited alloy of Zirconium-Aluminum, capable of removing, e.g., chemically or by absorption, any residual molecules of gas present in the vacuum-sealed cavities 255, 260.

Figure 3:
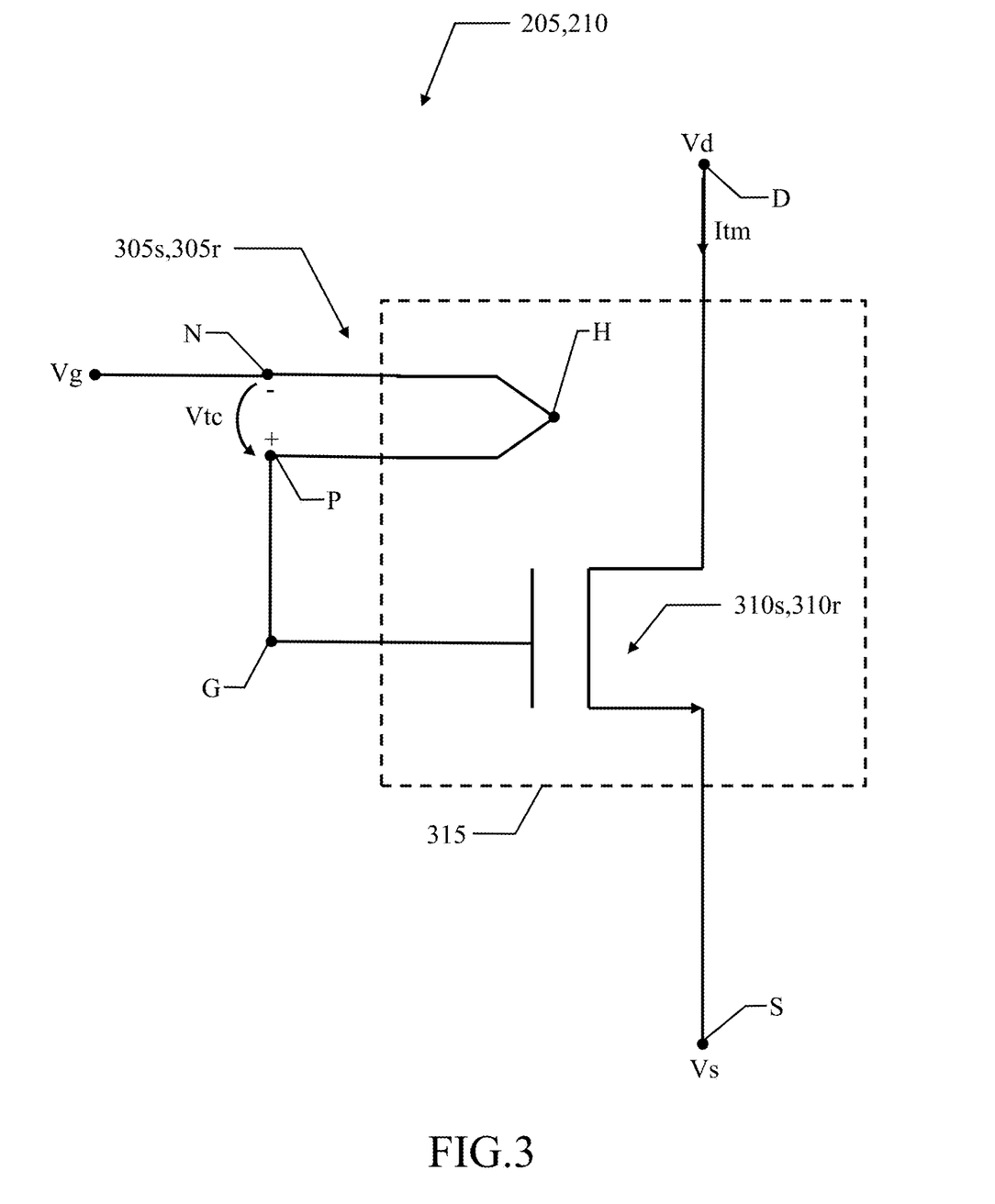
FIG. 3 shows a simplified circuital schema of a sensing element of the thermographic sensor according to an embodiment of the present disclosure.

With reference now to FIG. 3, a simplified circuital schema is shown of a sensing/reference element 205, 210 of the thermographic sensor according to an embodiment of the present disclosure.

The sensing/reference element 205, 210 has a hybrid structure based on the combination of a thermo-couple 305s, 305r (or more) and a (sensing/reference) transistor 310s, 310r (or more). For the sake of simplicity, reference is made in the following to the sensing element 205, with the same considerations that apply to the reference element 210 as well, apart that in this case both the thermo-couple 305r and the transistor 310r are shielded from the infrared radiations.

In some implementations, the thermo-couple 305s has a hot joint arranged to receive the infrared radiation to be sensed, e.g., so as to be heated to a temperature depending thereon, and a cold joint to be maintained at the environment temperature; in this way, the thermo-couple 305s provides a sensing voltage Vtc depending on the difference between the temperature of the hot joint and the temperature of the cold joint, and on an externally applied voltage Vg. The transistor 310s as well is arranged to receive the infrared radiation to be sensed, e.g., so as to be heated to a temperature depending thereon. Moreover, the transistor 310s is coupled with the thermo-couple 305s so as to be driven according to its sensing voltage Vtc. As a result, the transistor 310s provides the sensing signal of the sensing element 205 that depends on both the temperature of the transistor 310s and the sensing voltage Vtc.

For example, the transistor 310s is a thermally insulated MOS (TMOS) transistor, for example, of N-type, i.e., a MOS transistor made on a (thermally) insulated structure to as to have its electrical characteristics strongly depending on temperature. In this case, the TMOS transistor 310s has a source terminal S, a drain terminal D and a gate terminal G for accessing a source region, a drain region and a gate region, respectively. The thermo-couple 305s has a positive terminal P and a negative terminal N defining its cold joint, opposed to its hot joint H. The positive terminal P of the thermo-couple 305s is coupled with the gate terminal G of the TMOS transistor 310s.

The source region, the drain region and the gate region of the TMOS transistor 310s and the hot joint H of the thermo-couple 305s are arranged in a hot zone 315, e.g., to be heated up by the infrared radiation, whereas the source terminal S, the drain terminal D and the gate terminal G of the transistor 310s and the cold joint P-N of the thermo-couple 305s are arranged to be maintained at the environment temperature. In operation, the TMOS transistor 310s is biased by applying (biasing) voltages Vs, Vd, Vg for its source terminal S, drain terminal D and gate terminal G, respectively. In some implementations, the TMOS transistor 310s is biased to a subthreshold condition, e.g., wherein it is more sensitive to temperature, i.e., with a voltage Vgs between its source terminal S and gate terminal G lower than a threshold voltage Vth thereof; for example, this result is achieved by setting the voltage Vs to a reference value, or ground, the voltage Vd to 0.6 V and the voltage Vg to 0.21V (with respect to ground). In this condition, when no infrared radiation reaches the sensing element 205 the sensing voltage Vtc provided by the thermo-couple 305s is 0V, and then the gate terminal G of the TMOS transistor 310s receives the same voltage Vg. A corresponding subthreshold current Itm then flows between the drain terminal D and the source terminal S of the TMOS transistor 310s, where the current Itm can be used as the sensing signal of the sensing element 205, thereby referred to as sensing current Itm. Instead, when any infrared radiation reaches the sensing element 205 it heats both the thermo-couple 305s and the TMOS transistor 310s. As a result, the sensing current Itm provided by the TMOS transistor 310s increases as a function of the temperature. At the same time, the sensing voltage Vtc provided by the thermo-couple 305s as well increases as a function of the temperature, for example, of the order of 0.5-1.0 μV/° C. As a result, the voltage that is applied to the gate terminal G of the TMOS transistor 310s (Vg+Vtc) is boosted accordingly, which causes a corresponding further increase of the sensing current Itm provided by it.

The above-described solution significantly improves the performance of the sensing element 205, and then of the whole thermographic sensor. For example, in this way it is possible to increase the sensitivity and to reduce the response time, for example, up to an order of magnitude, such as passing from a sensitivity of a few nA/° C. of the TMOS transistor 310s alone to some tens of nA/° C. This reflects on a corresponding improvement of the performance of the thermographic device, for example, in terms of its noise equivalent temperature difference (NETD).

All of the above fosters the use of the thermographic devices in more fields, for example, in consumer applications, especially of mobile type.

Figure 4A:
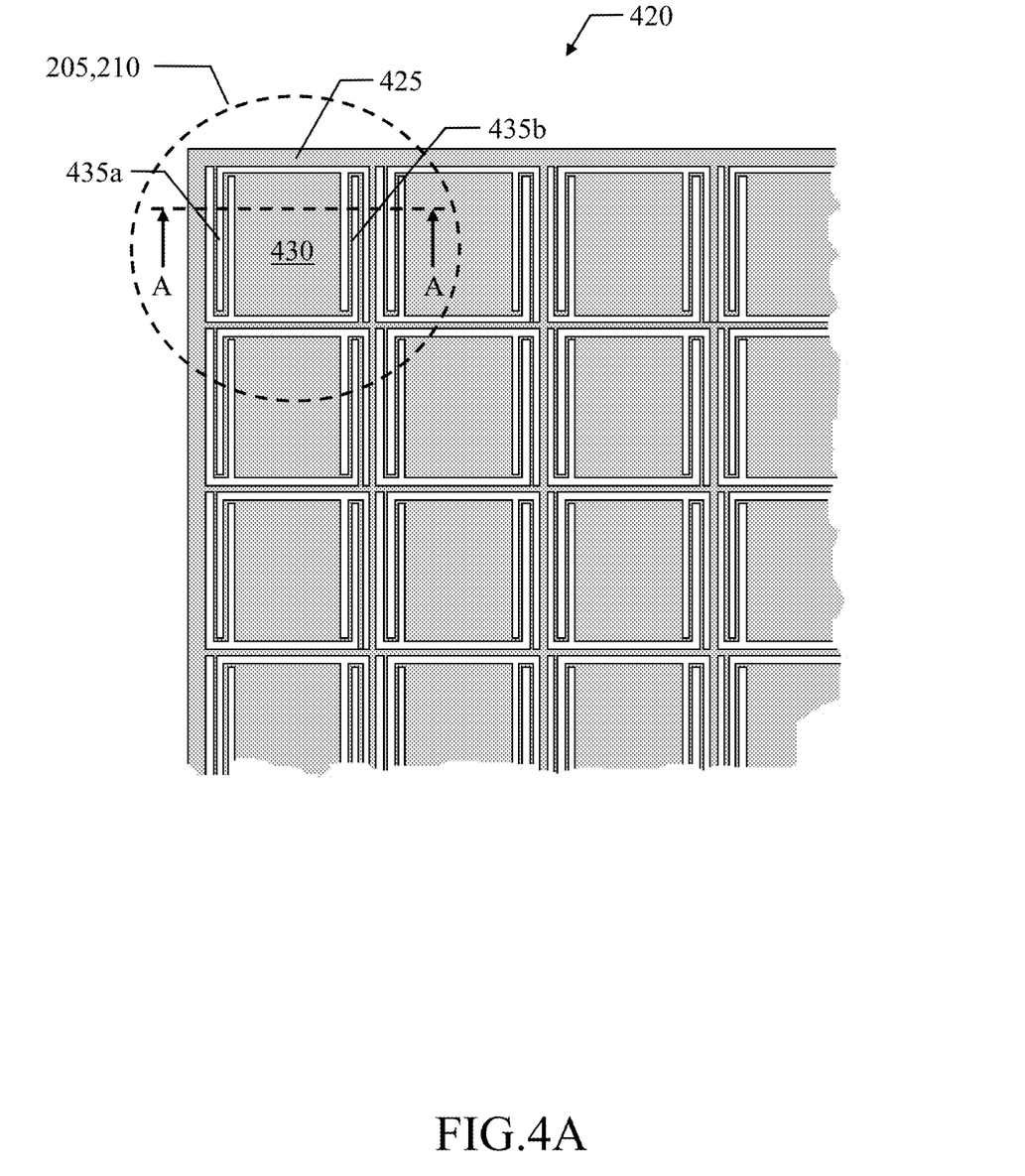
FIG. 4A-FIG. 4C show a schematic representation of a particular of the thermographic sensor according to an embodiment of the present disclosure.
Figure 4B:
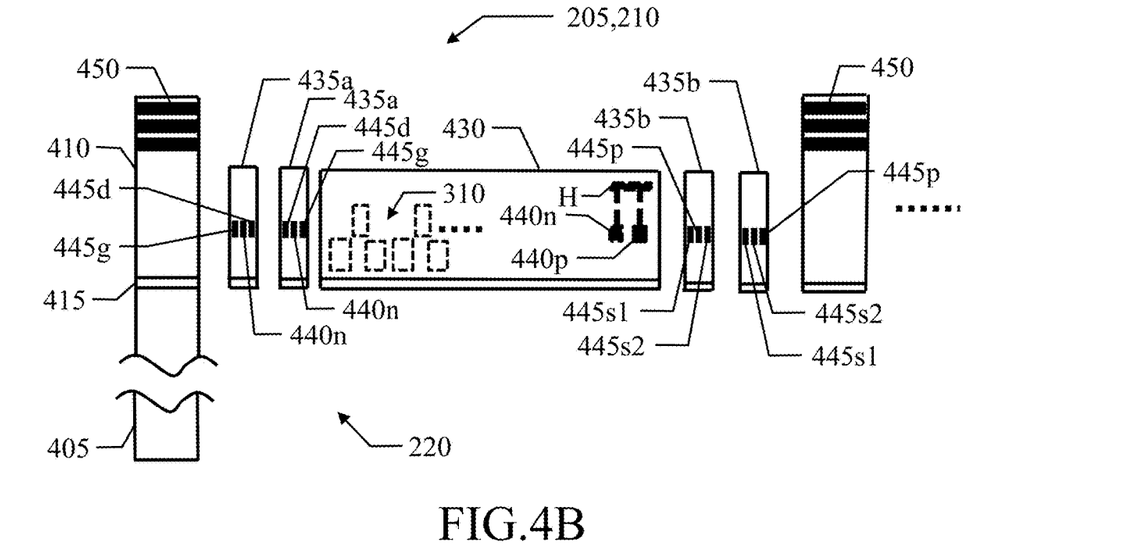
Figure 4C:
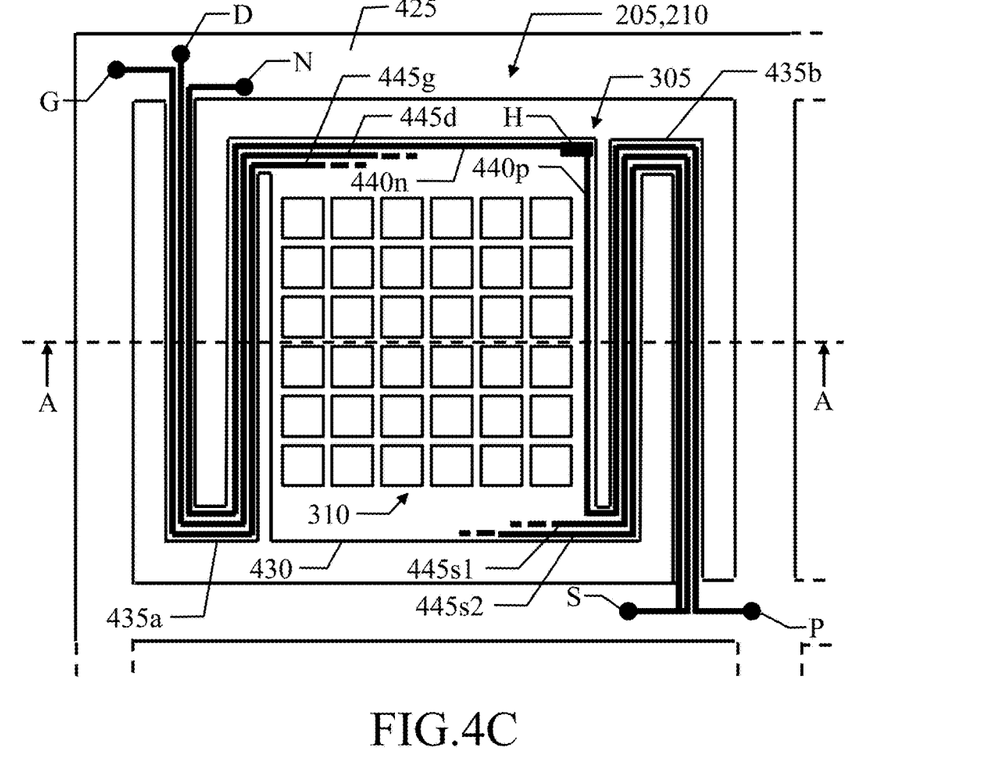

With reference now to FIG. 4A-FIG. 4C, a schematic representation is shown of details of the thermographic sensor according to an embodiment of the present disclosure.

FIG. 4A shows a top view of a portion of the array of sensing elements, FIG. 4B shows a cross-section view of a single sensing/reference element 205,210 along the plane A-A of FIG. 4A-FIG. 4C and FIG. 4C shows the arrangement of a single sensing/reference element 205,210 encircled in FIG. 4A.

The (SOI) die 220 has a layered structure comprising a substrate 405, such as of semiconductor material, like mono-crystal silicon, a functional layer 410, such as comprising an active layer of mono-crystal silicon, a layer of gate oxide, a layer of polysilicon, one or more layers of metal and one or more layers of insulating material, like silicon dioxide, and a buried insulating layer 415 of electrically insulating material, such as silicon oxide, that separate them. The die 220 is micro-machined to define the suspended membrane of the functional layer 410 and the insulating layer 415 housing the array of sensing/reference elements 205, 210, where suspended membrane is released from the substrate 405. The suspended membrane is patterned to define a grid 420. The grid 420 is defined by regularly spaced row crosspieces and column crosspieces, which cross each other, e.g., perpendicularly, to form corresponding frames 425, e.g., surrounding holes, for the sensing/reference elements 205, 210. For each sensing/reference element 205,210, the grid 420 then comprises a plate 430 that is suspended from the frame 425. For this purpose, one or more (holding) arms, two in the example at issue denoted with the references 435a and 435b, sustain the plate 430 from the frame 425; the arms 435a, 435b are relatively long, for example, with a U-like shape, and thin.

In each sensing/reference element 205, 210, the hot joint H of the thermo-couple and the sensing transistor, denoted generically with the references 305 and 310, respectively, are formed in the plate 430 and the cold joint P-N of the thermo-couple 305 is formed in the frame 425. More specifically, the thermo-couple 305 comprises a (first) conductor 440p of an (electrically) conductive material and a (second) conductor 440n of another (electrically) conductive material, for example, P+ polysilicon and N+ polysilicon, respectively, which extend between the frame 425 and the plate 430 through the arms 435b and 435a, respectively. The ends of the conductors 440p and 440n in the plate 430, for example, at a corner thereof, are short-circuited, for example, through a track of metal, such as Aluminum, to define the hot joint H of the thermo-couple 305. The ends of the conductors 440p and 440n in the frame 425 define the positive terminal P and the negative terminal N, respectively, of the cold joint of the thermo-couple 305. Moreover, another thermo-couple (not shown in the figure) may be formed in a similar way by two regions of the monocrystalline layer being doped with impurities of the P+ type and of the N+ type, which other thermo-couple is coupled in series to the thermo-couple 305 into a thermo-pile. For the sake of simplicity, in the following reference will be made to the single thermo-couple 305, with the same considerations that apply to the thermo-pile as well. The TMOS transistor 310 has a source region and a drain region, for example, of N+ type, and a gate region, for example, of P+ polysilicon, that is insulated from a channel formed between them, for example, with a cellular structure wherein the same structure is replicated in multiple cells, such as 64, which are connected in series/parallel among them. Corresponding conductors 445s1, 445s2, 445d and 445g of (electrically) conductive material, for example, P+ polysilicon and/or N+ polysilicon, extend between the frame 425 and the plate 430 through the arms 435a, 435b for connecting the source regions, the drain regions and the gate regions to the source terminal S, the drain terminal D and the gate terminal G, respectively. The conductors 445s1, 445s2 are duplicated to exploit a free one that remains in case the arms 435a and 435b are symmetric, each with 3 conductors. One or more conductive tracks 450 of a (thermally) conductive material, for example, three layers of metal such as Aluminum, extend along the frames 425 for thermally equalizing the cold joints P-N of the thermo-couples 305 with the substrate 405, thereby acting as heat-sink elements therefor, and for transmitting electrical signals.

The above-described structure provides a good thermal insulation between the plates 430 and the frames 425, e.g., a corresponding low thermal conduction coefficient Gth; in this way, it is possible to obtain a low thermal cross-talk among the sensing/reference elements 205,210. Moreover, the dissipation of heat from the frames 425 to the substrate 405, in addition to its thermal insulation from the plates 430, makes it possible to obtain a good sensitivity of the thermo-couples 305.

The positive/negative terminals P, N of the thermo-couples 305 and the source/drain/gate terminals S, D, G of the TMOS transistors 310 may be connected among them in the frames 425 in several ways according to corresponding architectures of the thermographic sensor.

Figure 5:
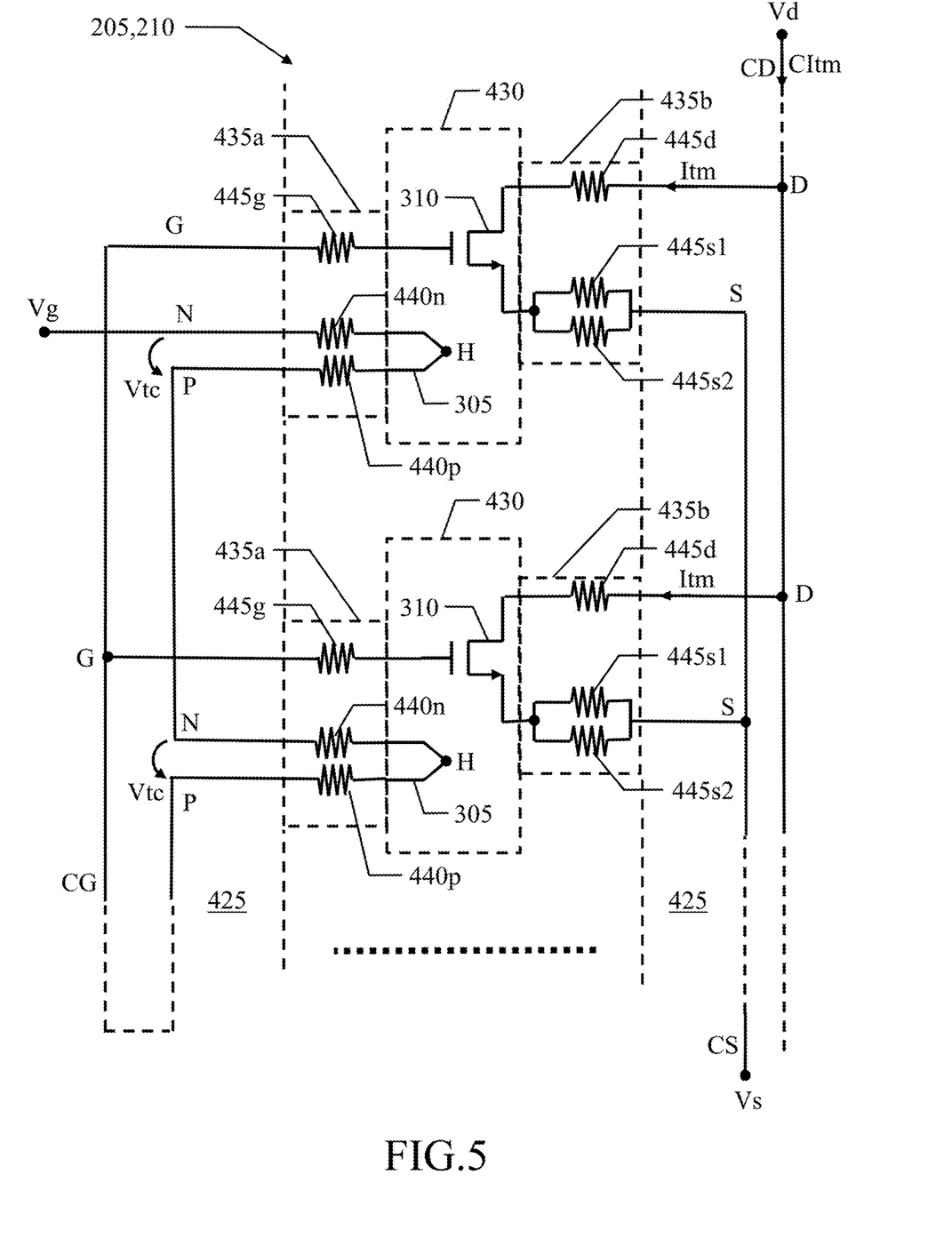
FIG. 5 shows an exemplary architecture of the thermographic sensor according to an embodiment of the present disclosure.

With reference now to FIG. 5, an example architecture is shown of the thermographic sensor according to an embodiment of the present disclosure.

In this case, the sensing/reference elements 205,210 are configured to operate together. In some implementations, the positive terminal P of each thermo-couple 305 different from a last one in their series, e.g., coupled with its hot joint H in the plate 430 through the arm 435a via the conductor 440p, is coupled, e.g., in the corresponding frames 425, with the negative terminal N of a next thermo-couple 305 in the series, e.g., coupled with its hot joint H in the plate 430 through the arm 435a via the conductor 440n. The source terminals S, the drain terminals D, and the gate terminals G of all the TMOS transistors 310, e.g., coupled with the source regions, the drain regions and the gate regions through the arms 435b, 435b and 435a via the conductors 455s1, 455s2, 455d and 455g, respectively, are coupled together in the corresponding frames 425 into a common source terminal CS, a common drain terminal CD and a common gate terminal CG, respectively. The negative terminal N of a first thermo-couple 305 in the series is a common biasing terminal of all the sensing/reference elements 205, 210 for receiving the voltage Vg; the positive terminal P of the last thermo-couple 305 is coupled with the common gate terminal CG of the TMOS transistors 310.

In this way, the thermo-couples 305 are connected in series, so as to provide a common sensing voltage, equal to the sum of their sensing voltages Vtc, which drives all the TMOS transistors 310. The TMOS transistors 310 are instead connected in parallel, so as to provide a common sensing current CItm, equal to the sum of their sensing currents Itm, flowing between their common source terminal CS and common drain terminal CD. This configuration emphasizes the above-mentioned advantages of the proposed solution.

Figure 6:
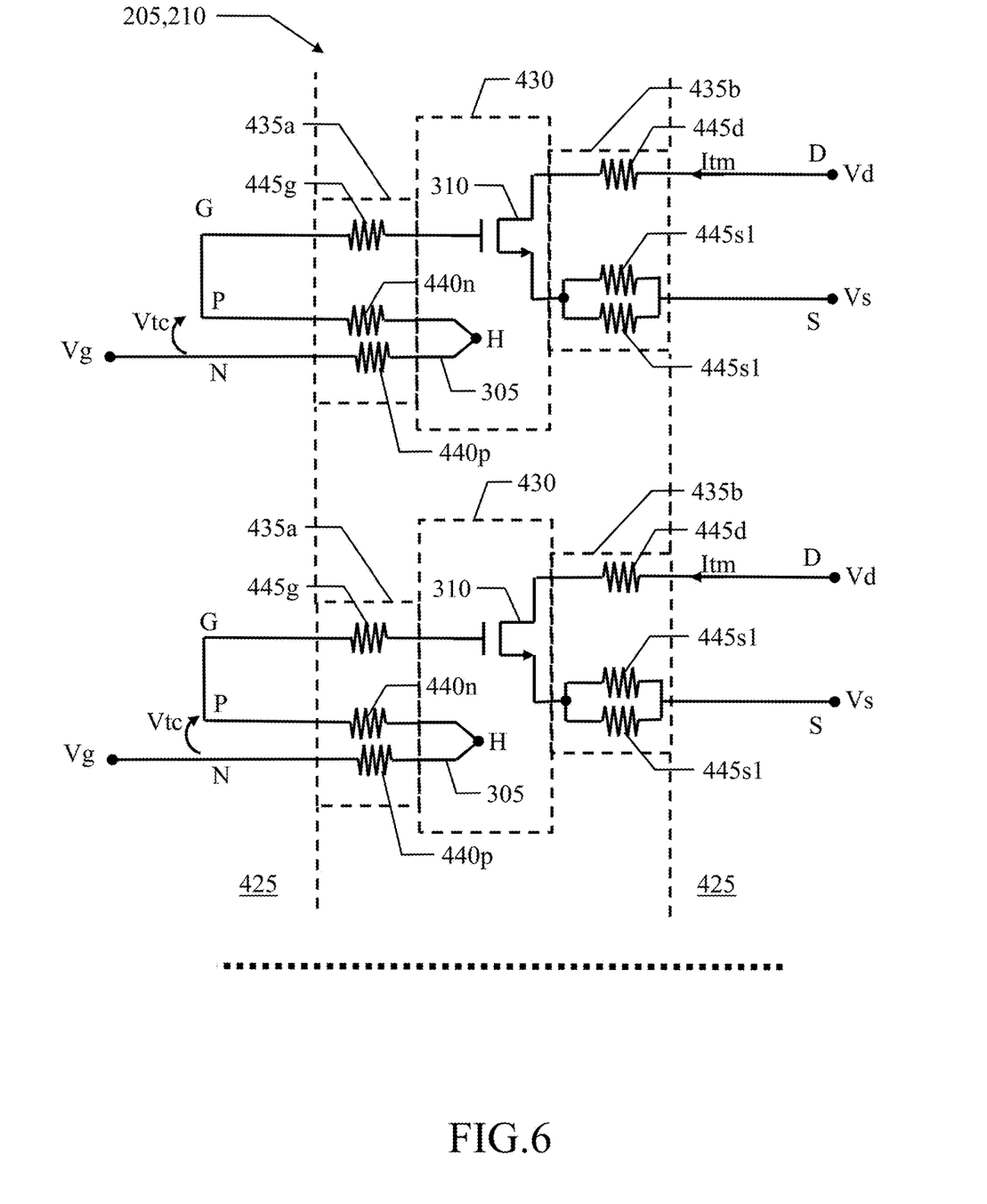
FIG. 6 shows another exemplary architecture of the thermographic sensor according to an embodiment of the present disclosure.

With reference now to FIG. 6, another example architecture is shown of the thermographic sensor according to an embodiment of the present disclosure.

In this case, the sensing/reference elements 205,210 are configured to operate individually. For example, each sensing/reference element 205,210 has the following configuration. The negative terminal N of the thermo-couple 305, e.g., coupled with its hot joint H in the plate 430 through the arm 435a via the conductor 440n, is a biasing terminal of the sensing/reference element 205, 210 for receiving the voltage Vg. The positive terminal P of the thermo-couple 305, e.g., coupled with its hot joint H in the plate 430 through the arm 435a via the conductor 440p, is coupled in the frame 425 with the gate terminal G of the TMOS transistor 310, e.g., coupled with the gate region through the arm 440a via the conductor 445g. The source terminal S and the drain terminal D of the TMOS transistor 310, e.g., coupled with the source region and the drain region through the arms 435b and 435b via the conductors 455s1, 455s2 and 455d, respectively, receive the biasing voltages Vs and Vd, respectively, in the frame 425.

In this way, the thermo-couple 305 drives the TMOS transistor 310 with its sensing voltage Vtc. The TMOS transistor 310 accordingly provides its sensing current Itm, flowing between the source terminal S and the drain terminal D. This configuration applies the above-mentioned advantages independently for the different sensing/reference elements 205,210.

For example, the sensing/reference elements 205,210 may be enabled in succession at the level of rows. For this purpose, the source terminals S of all the sensing/reference elements 205,210 are coupled with a reference terminal, e.g., for receiving the ground voltage. The drain terminals D of the sensing/reference elements 20,210 of each column of the array are coupled with a corresponding column line, and the biasing terminals, e.g., coupled with the gate terminals G, of the sensing/reference elements 205,210 of each row of the array are coupled with a corresponding row line. In a rest condition, all the row lines and column lines are biased to ground, so that all the TMOS transistors 310 do not provide any current. During a sensing operation, all the column lines are biased to the voltage Vd. The sensing/reference elements 205,210 of the rows are then selected in succession. For this purpose, the row line of the selected row is biased to the voltage Vg. As a result, the corresponding TMOS transistors 310 provide their sensing currents Itm that flow along the corresponding column lines. The sensing currents Itm are converted into voltages, e.g., by corresponding sense amplifiers, that are output by the thermographic sensor 105.

Figure 7:
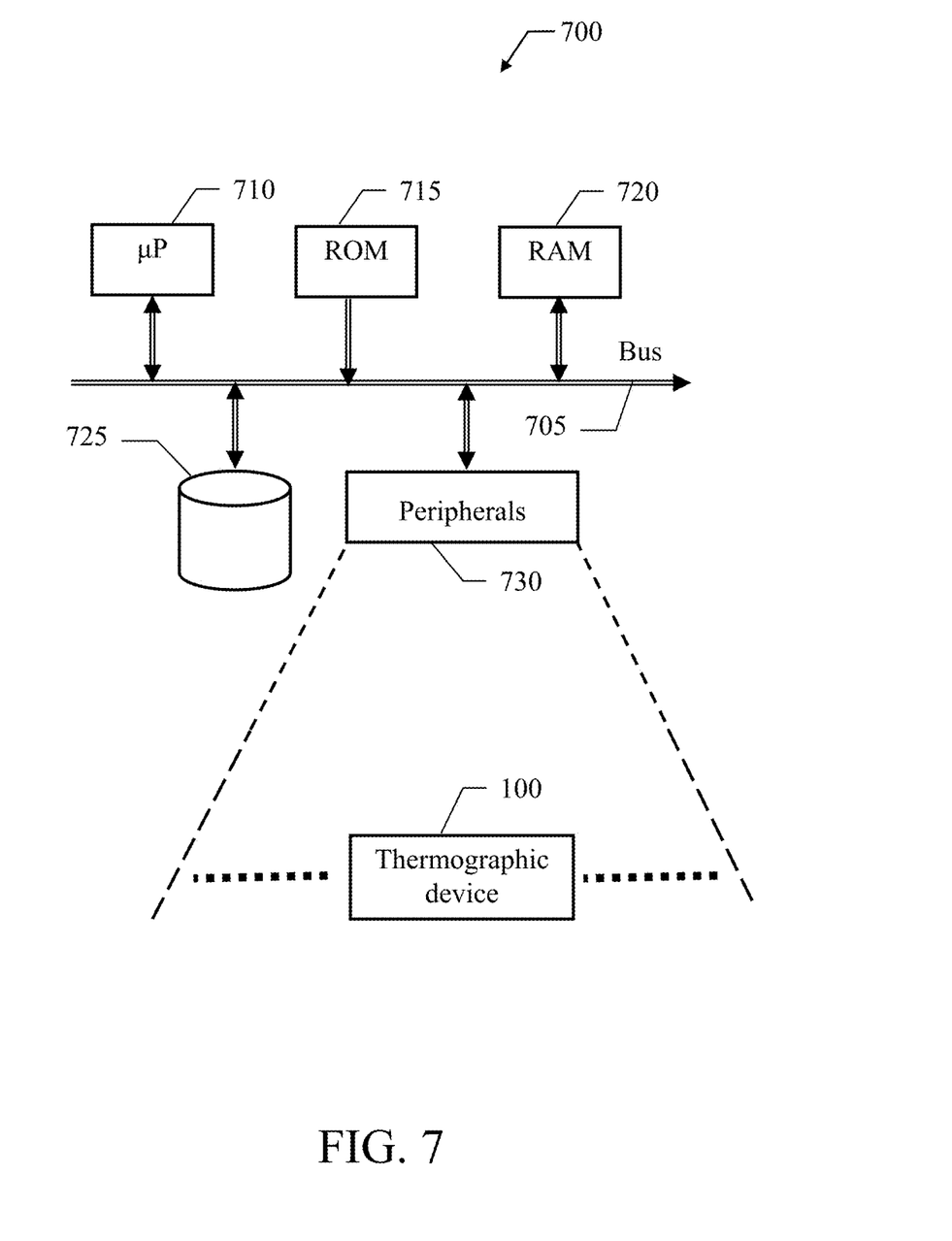
FIG. 7 shows a schematic block diagram of a system incorporating the thermographic device according to an embodiment of the present disclosure.

With reference now to FIG. 7, a schematic block diagram is shown of a system 700 incorporating the thermographic device 100 according to an embodiment of the present disclosure.

For example, the system 700 is a thermo-scanner or a smart-phone when the thermographic device 100 is based on a thermographic sensor operating globally or individually, respectively. The system 700 comprises several units that are connected among them through a bus structure 705 (with one or more levels). For example, a microprocessor (μP) 710, or more, provides a logic capability of the system 700; a non-volatile memory (ROM) 715 stores basic code for a bootstrap of the system 700 and a volatile memory (RAM) 720 is used as a working memory by the microprocessor 710. The system has a mass-memory 725 for storing programs and data (for example, a flash EPROM). Moreover, the system 700 comprises a number of controllers of peripherals 730 comprising the above-described thermographic device 100. For example, in case of the thermo-scanner the thermographic device 100 implements an infrared thermometer (with the peripherals 730 further comprising control buttons, a display and so on); in case of the smart-phone, instead, the thermographic device 100 implements an infrared camera (with the peripherals 730 further comprising a telephone transceiver, a Wi-Fi WNIC, a touch-screen, a GPS receiver, an accelerometer and so on).

Naturally, in order to satisfy local and specific requirements, a person skilled in the art may apply many logical and/or physical modifications and alterations to the present disclosure. More specifically, although this disclosure has been described with a certain degree of particularity with reference to one or more embodiments thereof, it should be understood that various omissions, substitutions and changes in the form and details as well as other embodiments are possible. For example, different embodiments of the present disclosure may be practiced even without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. Moreover, items presented in a same group and different embodiments, examples or alternatives are not to be construed as de facto equivalent to each other (but they are separate and autonomous entities). In any case, each numerical value should be read as modified according to applicable tolerances; for example, unless otherwise indicated, the terms "substantially", "about", "approximately" and the like should be understood as within 10%, preferably 5% and still more preferably 1%. Moreover, each range of numerical values should be intended as expressly specifying any possible number along the continuum within the range (comprising its end points). Ordinal or other qualifiers are merely used as labels to distinguish elements with the same name but do not by themselves connote any priority, precedence or order. The terms include, comprise, have, contain, involve and the like should be intended with an open, non-exhaustive meaning (i.e., not limited to the recited items), the terms based on, dependent on, according to, function of and the like should be intended as a non-exclusive relationship (i.e., with possible further variables involved), the term a/an should be intended as one or more items (unless expressly indicated otherwise), and the term means for (or any means-plus-function formulation) should be intended as any structure adapted or configured for carrying out the relevant function.

For example, an embodiment provides a thermographic sensor for sensing a thermal radiation. However, the thermographic sensor may be used for sensing any thermal radiation (for example, in the frequency range of infrared, terahertz, microwave and so on) for any purpose (for example, for measuring the temperature of objects, acquiring thermographic images, detecting presence of objects, detecting movements and so on).

In an embodiment, the thermographic sensor comprises one or more thermo-couples. However, the thermo-couples may be in any number and arranged in any way (for example, in a 2-D matrix, a linear vector and so on).

In an embodiment, each thermo-couple has a hot joint arranged to receive the thermal radiation (thereby being heated to a temperature depending thereon) and a cold joint arranged to be maintained at a temperature independent thereof, which cold joint is adapted to provide a sensing voltage depending on a difference between the temperature of the hot joint and the temperature of the cold joint. However, the thermo-couple may be of any type (for example, polysilicon/polysilicon, polysilicon/metal, silicon/metal and so on).

In an embodiment, the thermographic sensor comprises one or more sensing transistors. However, the sensing transistors may be in any number and arranged in any way (for example, either the same or different with respect to the thermo-couples).

In an embodiment, the sensing transistors are arranged to receive the thermal radiation (thereby being heated to a temperature depending thereon). However, the sensing transistors may be arranged for this purpose in any way (for example, together with the corresponding thermo-couples, separated therefrom and so on).

In an embodiment, the sensing transistors are coupled with corresponding one or more of the thermo-couples to be driven according to the corresponding sensing voltages. However, the sensing transistors may be coupled with the thermo-couples in any way (for example, with a corresponding thermo-couple or group of thermo-couples coupled with each sensing transistor, all the thermo-couples coupled with all the sensing transistors and so on) to be driven in any way (for example, directly, via a voltage-to-current converter, via an amplifier and so on).

In an embodiment, the sensing transistors are adapted to provide a sensing electrical signal depending on the temperature thereof and on the corresponding sensing voltages. However, the sensing electrical signal may be of any type (for example, a current, a voltage and so on).

In an embodiment, the thermographic sensor comprises one or more reference transistors. However, the reference transistors may be in any number and arranged in any way (for example, either the same or different with respect to the sensing transistors, either driven by further thermo-couples or not, and so on).

In an embodiment, each reference transistor is arranged to be shielded from the thermal radiation (thereby remaining at a temperature independent thereof), with the reference transistor that is adapted to provide a reference electrical signal depending on the temperature thereof. However, the reference transistors may be shielded in any way (for example, all together, individually and so on) and each reference electrical signal may be of any type (for example, either the same or different with respect to the sensing electrical signal).

In an embodiment, the thermographic sensor comprises a comparison circuit for providing one or more temperature electrical signals indicative of the thermal radiation. However, the temperature electrical signals may be in any number (for example, a single one of the whole thermographic sensor, one for each sensing transistor or group of sensing transistors and so on).

In an embodiment, the temperature electrical signals are provided according to a comparison between the sensing electrical signals of the sensing transistors and the reference electrical signals of the reference transistors. However, the temperature electrical signals may be provided according to any comparison (for example, by comparing a common sensing electrical signal of all the sensing transistors with a single reference electrical signal, the sensing electrical signal of each sensing transistor or group of sensing transistors with a corresponding reference electrical signal, and so on).

Further embodiments provide additional advantageous features, which may however be omitted at all in a basic implementation.

For example, in an embodiment the thermographic sensor comprises one or more further thermo-couples. However, the further thermo-couples may be in any number and arranged in any way (either the same or different with respect to the thermo-couples).

In an embodiment, each further thermo-couple has a further hot joint and a further cold joint adapted to provide a further sensing voltage depending on a difference between the temperature of the further hot joint and the temperature of the further cold joint. However, the further thermo-couples may be of any type (either the same or different with respect to the thermo-couples).

In an embodiment, the further thermo-couples are arranged to be shielded from the thermal radiation thereby remaining at a temperature independent thereof. However, the further thermo-couples may be shielded in any way (either the same or different with respect to the reference transistors).

In an embodiment, each of the reference transistors is coupled with corresponding one or more of the further thermo-couples to be driven according to the corresponding further sensing voltages thereby providing the corresponding reference electrical signal further depending on the corresponding further sensing voltages. However, the reference transistors may be coupled with the further thermo-couples in any way so as to be driven in any way (either the same or different with respect to the sensing transistors).

In an embodiment, the thermographic sensor comprises one or more sensing elements each comprising at least one of the thermo-couples and at least one of the sensing transistors. However, the sensing element may comprise any number of thermo-couples (for example, a single thermo-couple, a thermo-pile formed by a plurality of thermo-couples connected in series and so on) and any number of sensing transistors (for example, a single sensing transistor, with either a singular structure or a cellular structure formed by any number of cells connected in series and/or parallel, any number of sensing transistors connected in series and/or parallel, and so on).

In an embodiment, the thermographic sensor comprises corresponding one or more reference elements, each comprising at least one of the reference transistors. However, the reference transistors corresponding to each sensing element may be in any number (for example, either the same or different with respect to the sensing transistors of the sensing element).

In an embodiment, the sensing elements are integrated on a body of semiconductor on insulator type. However, the body may be of any type (for example, SOI, SOS and more generally even not of the semiconductor on insulator type, such as with an epitaxial layer grown on a substrate) and provided in any way (for example, packaged, in raw wafer form, as a bare die and so on). The thermographic sensor may be manufactured with any technologies, with masks being different in number and type, and with different process steps/parameters. Moreover, the above-described solution may be part of the design of an integrated device. The design may also be created in a hardware description language; moreover, if the designer does not manufacture chips or masks, the design may be transmitted by physical means to others.

In an embodiment, the body comprises a substrate. However, the substrate may be of any type (for example, Silicon, Germanium, with any type and concentration of dopants, and so on).

In an embodiment, the body comprises a functional layer of semiconductor material. However, the functional layer may be of any type (for example, either the same or different with respect to the substrate).

In an embodiment, the body comprises an insulating layer interposed between the substrate and the functional layer. However, the insulating layer may be of any type (for example, silicon oxide, silicon nitride and so on).

In an embodiment, the body is patterned to define a grid (of the functional layer and the insulating layer) suspended from the substrate. However, the grid may have any shape, size and structure; this result may be achieved in any way (for example, with MEMS, NEMS, and the like process steps, applied after, before and/or during the integration of the sensing elements, and so on).

In an embodiment, for each of the sensing elements the grid comprises a frame, a plate and one or more arms sustaining the plate from the frame. However, the frames and the plates may be of any size and shape (for example, squared, rectangular and so on, either the same or different to each other), the arms may be in any number and in any position (for example, at the borders, the corners and so on of the plate) and they may have any length, width and shape (for example, U-like, S-like, straight and so on).

In an embodiment, the sensing transistor of the sensing element is formed in the plate. However, the sensing transistor may be arranged in the plate in any way (for example, taking most of it, at the center, in a lateral portion and so on).

In an embodiment, the thermo-couple of the sensing element comprises a first conductor (of a first electrically conductive material) extending from a first terminal of the cold joint in the frame to the plate through one of the arms. However, the first conductor may be of any material (for example, deposited polysilicon/metal, implanted/diffused dopants) and it may extend in any way into the plate (for example, along one or more borders, to the center and so on).

In an embodiment, the thermo-couple of the sensing element comprises a second conductor (of a second electrically conductive material, different from the first electrically conductive material) extending from a second terminal of the cold joint in the frame to the plate through one of the arms. However, the second conductor may be of any material and it may extend in any way into the plate (for example, either the same or different with respect to the first conductor) and through any arm (for example, the same of the first conductor or another one).

In an embodiment, the first conductor and the second conductor are short-circuited at the plate into the hot joint. However, the first conductor and the second conductor may be short-circuited at any position (for example, at a corner, a border, the center and so on of the plate) and in any way (for example, via any connection element, such as of metal, polysilicon and the like, directly and so on).

In an embodiment, the thermographic sensor comprises a plurality of the sensing elements. However, the sensing elements may be in any number and arranged in any way (for example, in a 2-D matrix, a linear vector and so on).

In an embodiment, the sensing transistors of the sensing elements are coupled to provide a common sensing electrical signal based on the sum of the sensing electrical signals thereof. However, the sensing transistors may be coupled in any way (for example, in parallel to provide a common sensing current, in series to provide a common sensing voltage and so on).

In an embodiment, the thermo-couples of the sensing elements are coupled in series to provide a common sensing voltage based on a sum of the sensing voltages thereof for driving all the sensing transistors. However, the common sensing voltage may drive the sensing transistors in any way (see above).

In an embodiment, the comparison circuit is adapted to provide one of the temperature electrical signals according to a comparison between the common sensing signal and a common reference signal provided by the reference elements. However, the single temperature electrical signal may be provided in any way (see above).

In an embodiment, each of the sensing transistors has a first conduction terminal and a second conduction terminal for providing the corresponding sensing electrical signal being a sensing current. However, the first/second conduction terminals may be of any type (for example, source/drain terminals in a MOS transistor, emitter/collector terminals in a BJT transistor and so on).

In an embodiment, the first conduction terminals and the second conduction terminals of the sensing transistors are coupled in parallel into a common first conduction terminal and a common second conduction terminal, respectively, for providing the common sensing electrical signal being a common sensing current. However, the first/second conduction terminals may be coupled in parallel in any way (for example, by accessing each of them through one or more conductors through the same or different arms, and so on).

In an embodiment, each of the sensing transistors has a control terminal for controlling the sensing transistor. However, the control terminal may be of any type (for example, gate terminal in a MOS transistor, base terminal in a BJT transistor and so on).

In an embodiment, the control terminals of the sensing transistors are coupled in parallel into a common control terminal for receiving the common sensing voltage. However, the control terminals may be coupled in parallel in any way (for example, by accessing each of them through one or more conductors through the same or different arms with respect to the first/second conduction terminals, and so on).

In an embodiment, the second terminal of each thermo-couple different from a last one of the thermo-couples is coupled with the first terminal of a next one of the thermo-couples in the corresponding frames. However, this connection may be made in any way (for example, with a track of polysilicon, metal and the like, directly and so on).

In an embodiment, the first terminal of a first one of the thermo-couples defines a biasing terminal for receiving a biasing voltage of the thermographic sensor. However, the first thermo-couple and the biasing terminal may be arranged at any position (for example, a corner, a border and so on of the grid) and the biasing voltage may have any value for biasing the sensing transistors in any way (for example, to the subthreshold condition, to the conduction condition and so on).

In an embodiment, the second terminal of the last thermo-couple is coupled with the control terminal of each of the sensing transistors through a corresponding one of the arms. However, the last thermo-couple may be arranged at any position (for example, a corner, a border and so on of the grid) and it may be coupled with the control terminal of each sensing transistor any way (for example, with any number of conductors through the same arm of its first conductor and/or through another arm, and so on).

In an embodiment, in each of the sensing elements the sensing transistor is coupled with the thermo-couple to be driven according to the corresponding sensing voltage. However, the sensing voltage may drive the sensing transistor in any way (see above).

In an embodiment, the comparison circuit is adapted to provide a corresponding one of the temperature electrical signals for each of the sensing elements according to a comparison between the sensing signal of the sensing transistor thereof and the reference signal of the corresponding reference element. However, the temperature electrical signal may be provided in any way (see above).

In an embodiment, in each of the sensing elements the second terminal of the thermo-couple is coupled with the control terminal of the sensing transistor through one of the arms. However, this coupling may be obtained in any way (for example, with any number of conductors through the same arm of the first conductor of the thermo-pile and/or through another arm, and so on).

In an embodiment, the sensing transistors are TMOS transistors. However, the TMOS transistors may be of any type (for example, NMOS, PMOS and so on).

An embodiment provides a thermographic device. However, the thermographic device may be of any type (for example, a thermo-scanner, a camera, a movement sensor and so on).

In an embodiment, the thermographic device comprises the thermographic sensor of above and a signal processing circuit that is coupled with the thermographic sensor for processing the temperature signals. However, the signal processing circuit may apply any number and type of processing operations (for example, partial, different and additional processing operations with respect to the ones mentioned above); moreover, the signal processing circuit may be of any type (for example, integrated on a separate body of any type, either the same or different with respect to the one of the thermographic sensor, together with the thermographic sensor in the same body, and so on), with the thermographic sensor and the processing circuit that may be coupled in any way (for example, in a common package, a common chip, on a PCB and so on).

An embodiment provides a system comprising at least one thermographic device of above. However, the system may comprise any number of thermographic devices and it may be of any type (for example, for ensuring social distancing, controlling air conditioners, monitoring food transportations, detecting hot spots, assisting people, controlling accesses and so on).

Generally, similar considerations apply if the thermographic sensor, the thermographic device and the system each has a different structure or comprises equivalent components (for example, of different materials) or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

A thermographic sensor (105) for sensing a thermal radiation, wherein the thermographic sensor (105) may be summarized as including one or more thermo-couples (305s) each having a hot joint (H) arranged to receive the thermal radiation thereby being heated to a temperature depending thereon and a cold joint (P-N) arranged to be maintained at a temperature independent thereof, the cold joint (P-N) being adapted to provide a sensing voltage depending on a difference between the temperature of the hot joint (H) and the temperature of the cold joint (P-N), one or more sensing transistors (310s) each arranged to receive the thermal radiation thereby being heated to a temperature depending thereon and coupled with corresponding one or more of the thermo-couples (305s) to be driven according to the corresponding sensing voltages, the sensing transistor (310s) being adapted to provide a sensing electrical signal depending on the temperature thereof and on the corresponding sensing voltages, one or more reference transistors (310r) each arranged to be shielded from the thermal radiation thereby remaining at a temperature independent thereof, the reference transistor (310r) being adapted to provide a reference electrical signal depending on the temperature thereof, and a comparison circuit (215) for providing one or more temperature electrical signals indicative of the thermal radiation according to a comparison between the sensing electrical signals of the sensing transistors (310s) and the reference electrical signals of the reference transistors (310r).

The thermographic sensor (105) may include one or more further thermo-couples (305r) each having a further hot joint (H) and a further cold joint (P-N) adapted to provide a further sensing voltage depending on a difference between the temperature of the further hot joint (H) and the temperature of the further cold joint (P-N), the further thermo-couples (305r) being arranged to be shielded from the thermal radiation thereby remaining at a temperature independent thereof, and each of the reference transistors (310r) may be coupled with corresponding one or more of the further thermo-couples (305r) to be driven according to the corresponding further sensing voltages thereby providing the corresponding reference electrical signal further depending on the corresponding further sensing voltages.

The thermographic sensor (105) may include one or more sensing elements (205), each including at least one of the thermo-couples (305s) and at least one of the sensing transistors (310s), and the thermographic sensor (105) may include corresponding one or more reference elements (210), each including at least one of the reference transistors (310r).

The sensing elements (205) may be integrated on a body (220) of semiconductor on insulator type, wherein the body (220) may include a substrate (405), a functional layer (410) and an insulating layer (415) interposed between the substrate (405) and the functional layer (410), the body (220) being patterned to define a grid (420) of the functional layer (410) and the insulating layer (415) suspended from the substrate (405), wherein for each of the sensing elements (205) the grid (420) may include a frame (425), a plate (430) and one or more arms (435a,435b) sustaining the plate (430) from the frame (425), wherein the sensing transistor (310s) of the sensing element (205) is formed in the plate (430) and wherein the thermo-couple (305s) of the sensing element (205) may include a first conductor (440p) of a first electrically conductive material extending from a first terminal (P) of the cold joint in the frame (425) to the plate (430) through one of the arms (435a,435b) and a second conductor (440n) of a second electrically conductive material, different from the first electrically conductive material, extending from a second terminal (N) of the cold joint in the frame (425) to the plate (430) through one of the arms (435a,435b), the first conductor (440p) and the second conductor (440n) being short-circuited at the plate (430) into the hot joint (H).

The thermographic sensor (105) may include a plurality of the sensing elements (205), the sensing transistors (310s) of the sensing elements (205) being coupled to provide a common sensing electrical signal based on the sum of the sensing electrical signals thereof and the thermo-couples (305s) of the sensing elements (205) being coupled in series to provide a common sensing voltage based on a sum of the sensing voltages thereof for driving all the sensing transistors (310s), and the comparison circuit (215) may be adapted to provide one of the temperature electrical signals according to a comparison between the common sensing signal and a common reference signal provided by the reference elements (210).

Each of the sensing transistors (310s) may have a first conduction terminal (S) and a second conduction terminal (D) for providing the corresponding sensing electrical signal being a sensing current, the first conduction terminals (S) and the second conduction terminals (D) of the sensing transistors (310s) being coupled in parallel into a common first conduction terminal (S) and a common second conduction terminal (D), respectively, for providing the common sensing electrical signal being a common sensing current, and each of the sensing transistors (310s) may have a control terminal (G) for controlling the sensing transistor (310s), the control terminals (G) of the sensing transistors (310s) being coupled in parallel into a common control terminal (G) for receiving the common sensing voltage.

The second terminal (N) of each thermo-couple (305s) different from a last one of the thermo-couples (305s) may be coupled with the first terminal (P) of a next one of the thermo-couples (305s) in the corresponding frames (425), the first terminal (P) of a first one of the thermo-couples (305s) defining a biasing terminal for receiving a biasing voltage (Vg) of the thermographic sensor (105) and the second terminal (N) of the last thermo-couple (305s) being coupled with the control terminal (G) of each of the sensing transistors (310s) through a corresponding one of the arms (435a,435b).

The thermographic sensor (105) may include a plurality of the sensing elements (205), in each of the sensing elements (205) the sensing transistor (310s) being coupled with the thermo-couple (305s) to be driven according to the corresponding sensing voltage, and the comparison circuit (215) may be adapted to provide a corresponding one of the temperature electrical signals for each of the sensing elements (205) according to a comparison between the sensing signal of the sensing transistor (310s) thereof and the reference signal of the corresponding reference element (210).

In each of the sensing elements (205) the second terminal (N) of the thermo-couple (305s) may be coupled with the control terminal (G) of the sensing transistor (310s) through one of the arms (435a,435b).

The sensing transistors (310s) may be TMOS transistors (310s).

A thermographic device (100) may be summarized as including the thermographic sensor (105) and a signal processing circuit (110) being coupled with the thermographic sensor (105) for processing the temperature signals.

A system (700) may be summarized as including at least one thermographic device (100).

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thermographic sensor for sensing a thermal radiation, the thermographic sensor comprising:
a body including a first cavity and a second cavity, the body having a membrane including a frame;
one or more thermocouples each having a hot joint configured to be heated to a temperature in response to the thermal radiation and a cold joint configured to be maintained at a temperature independent of the thermal radiation, each thermocouples being configured to provide a sensing voltage based on a difference between the temperature of the hot joint and the temperature of the cold joint;
one or more sensing transistors each configured to be heated to a temperature in response to the thermal radiation and coupled with corresponding one or more of the thermocouples and having a gate terminal coupled to be driven with a corresponding sensing voltage, each sensing transistor being configured to provide a sensing electrical signal based on the temperature of the sensing transistor and on the corresponding sensing voltage;
one or more reference transistors each configured to be shielded from the thermal radiation and have a temperature independent of the thermal radiation, each reference transistor being configured to provide a reference electrical signal based on the temperature of the reference transistor; and
a comparison circuit configured to provide one or more temperature electrical signals indicative of the thermal radiation based on a comparison between a sensing electrical signal of the one or more sensing transistors and a reference electrical signal of the one or more reference transistors.

2. The thermographic sensor according to claim 1, wherein the thermographic sensor comprises one or more reference thermocouples each having a hot joint and a cold joint configured to provide a sensing voltage based on a difference between the temperature of the hot joint and the temperature of the cold joint of the reference thermocouples, the reference thermocouples being configured to be shielded from the thermal radiation and have at a temperature independent of the thermal radiation, and each of the reference transistors is coupled with one or more reference thermocouples and configured to be driven according to a corresponding sensing voltage of the one or more reference thermocouples and to provide a reference electrical signal based on the reference sensing voltages of the one or more reference thermocouples.

3. The thermographic sensor according to claim 1, wherein the thermographic sensor comprises one or more sensing elements, each sensing element including at least one of the one or more thermocouples and at least one of the one or more sensing transistors, and wherein the thermographic sensor comprises one or more reference elements corresponding to the one or more sensing elements, each reference element comprising at least one of the one or more reference transistors.

4. The thermographic sensor according to claim 3, wherein the sensing elements are integrated on the body having a substrate, a functional layer and an insulating layer interposed between the substrate and the functional layer, the body being patterned to define a grid of the functional layer and the insulating layer suspended from the substrate, wherein for each of the one or more sensing elements the grid comprises the frame, a plate and one or more arms coupling the plate from the frame, wherein the sensing transistor of the sensing element is formed in the plate and wherein the thermocouple of the sensing element comprises a first conductor of a first electrically conductive material extending from a first terminal of the cold joint in the frame to the plate through one of the arms and a second conductor of a second electrically conductive material, different from the first electrically conductive material, extending from a second terminal of the cold joint in the frame to the plate through one of the arms, the first conductor and the second conductor being short-circuited at the plate into the hot joint.

5. The thermographic sensor according to claim 3, wherein the thermographic sensor comprises a plurality of sensing elements, the sensing transistors of the sensing elements being coupled to provide a common sensing electrical signal based on the sum of the sensing electrical signals of the plurality of sensing elements and the thermocouples of the plurality of sensing elements being coupled in series to provide a common sensing voltage based on a sum of the sensing voltages of the thermocouples for driving all the sensing transistors, and wherein the comparison circuit is configured to provide a temperature electrical signal based on a comparison between the common sensing signal.

6. The thermographic sensor according to claim 5, wherein each of the sensing transistors has a first conduction terminal and a second conduction terminal for providing the corresponding a sensing current as a sensing electrical signal, the first conduction terminals and the second conduction terminals of the sensing transistors being coupled in parallel into a common first conduction terminal and a common second conduction terminal, respectively, for providing a common sensing current as the common sensing electrical signal, and wherein each of the sensing transistors has a control terminal for controlling the sensing transistor, the control terminals of the sensing transistors being coupled in parallel into a common control terminal that is coupled to receive the common sensing voltage.

7. The thermographic sensor according to claim 6, wherein the second terminal of a first thermocouple is coupled with the first terminal of a second thermocouple in the corresponding frames, the first terminal of the first thermocouple being a biasing terminal for receiving a biasing voltage of the thermographic sensor and the second terminal of the second thermocouple being coupled with the control terminal of each of the sensing transistors through a corresponding one of the arms.

8. The thermographic sensor according to claim 1, wherein the thermographic sensor comprises a plurality of sensing elements, in each of the sensing elements the sensing transistor being coupled with a thermocouple to be driven based on sensing voltage of the thermocouple, and wherein the comparison circuit is configured to provide a corresponding one of the temperature electrical signals for each of the sensing elements according to a comparison between the sensing signal of the sensing transistor thereof and the reference signal of the corresponding reference element.

9. The thermographic sensor according to claim 8, wherein in each of the sensing elements the second terminal of the thermocouple is coupled with the control terminal of the sensing transistor through one of the arms.

10. The thermographic sensor according to claim 1, wherein the sensing transistors are thermally insulated MOS (TMOS) transistors.

* * * * *